(12) United States Patent
Rathi et al.

(10) Patent No.: US 7,768,311 B2
(45) Date of Patent: Aug. 3, 2010

(54) SUPPRESSING RINGING IN HIGH SPEED CMOS OUTPUT BUFFERS DRIVING TRANSMISSION LINE LOAD

(75) Inventors: Amit Kumar Rathi, Madhya Pradesh (IN); Ankit Srivastava, Uttar Pradesh (IN); Paras Garg, Uttar Pradesh (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 0 days.

(21) Appl. No.: 11/897,520

(22) Filed: Aug. 30, 2007

(65) Prior Publication Data

US 2008/0111580 A1 May 15, 2008

(30) Foreign Application Priority Data

Aug. 30, 2006 (IN) .................. 1949/DEL/2006

(51) Int. Cl.
*H03K 17/16* (2006.01)
*H03K 19/094* (2006.01)
(52) U.S. Cl. .......................... 326/83; 326/30
(58) Field of Classification Search ............ 326/30
See application file for complete search history.

(56) References Cited

U.S. PATENT DOCUMENTS 6,686,763 B1 * 2/2004 Yen .............................. 326/30

* cited by examiner

*Primary Examiner*—Rexford N Barnie
*Assistant Examiner*—Thienvu V Tran

(57) ABSTRACT

An output buffer circuit for improving an output during state transitions of CMOS buffers driving transmission line loads. The circuit generates variable output impedance proportional to the load transmission line impedance. The buffer includes an output stage, such as pull up/pull down drivers for receiving an input signal and generating an output signal. The pull up/pull down drivers are biased by a circuit that generates a control signal and varies its conductivity according to the control signal. The pull up/pull down drivers initially provide a relatively low impedance to reach a desired level during the initial transition period of the output and then slowly varies its impedance in response to the control signal to suppress the ringing effect. The control circuit coupled to the input node, output node and the power supply node to generate a control signal that biases the pull up/pull down driver.

20 Claims, 10 Drawing Sheets

SUPPRESSING RINGING IN HIGH SPEED CMOS OUTPUT BUFFERS DRIVING TRANSMISSION LINE LOAD

CROSS-REFERENCE TO RELATED APPLICATIONS

The present application is related to Indian Patent Application No. 1949/Del/2006, filed Aug. 30, 2006, entitled "CIRCUIT FOR SUPPRESSING RINGING IN HIGH SPEED CMOS OUTPUT BUFFER DRIVING TRANSMISSION LINE LOAD". Indian Patent Application No. 1949/Del/2006 is assigned to the assignee of the present application and is hereby incorporated by reference into the present disclosure as if fully set forth herein. The present application hereby claims priority under 35 U.S.C. §119(a) to Indian Patent Application No. 1949/Del/2006.

TECHNICAL FIELD

The present disclosure generally relates to integrated circuit output buffers and, more specifically, to variable impedance output buffers for improving an output of such buffers during state transitions.

BACKGROUND

The communication of digital signals over wires and cables gives rise to a number of problems. Some of these problems arise when communicating information between IC's or even over the short distances traversed on a single circuit board. In fact, in the context of the high speed IC's with rise/fall times of less than one nanosecond, transmission line effects are so severe that signal lines of more than one inch must be treated as transmission lines. Thus, high speed output buffers must be designed to consider these transmission line effects.

FIG. 1 illustrates an output buffer coupled to a transmission line. At the output stage of an integrated circuit, an output buffer is typically needed to transfer signals to the signal lines. The term "buffer" may also refer to an entire IC dedicated solely to driving the signal lines. An output buffer 16 coupled to a transmission line 14 is illustrated in FIG. 1. The transmission line has characteristic impedance $Z_0$. The output buffer 16 includes a pull up device and a pull down device, which exhibits output impedance $R_{LH}$ 106, when the output undergoes a low-to-high transition, and output impedance $R_{HL}$ 108 when undergoing a high-to-low transition. These impedances are, for the most part, contributed by pull-up and pull-down transistors at the output stage of the buffer.

FIG. 2 is a schematic diagram of a driver which may be employed in one of the output buffer devices 16, shown in FIG. 1.

FIG. 3A illustrates the output voltage of an output buffer 16 as it undergoes an output transition from a high state to a low state. The output waveform exhibits an intermediate step before falling to the low state. This step is caused by the fact that for a high-to-low transition, the resistor $R_{HL}$ in series with the characteristic impedance $Z_0$ acts as a voltage divider. The height of the step depends on the relative values of $R_{HL}$ and $Z_0$, and the length of the step depends upon the round trip electrical delay of the output signal through the transmission line. For high speed data transfer with rise/fall times less than 1ns, the impedance of output buffers are intentionally made much smaller than transmission line impedance. The low output driver impedance helps to achieve plateau level near to the low logic level which helps to achieve fall time specifications. In the open circuit context, one skilled in the art can easily understand that the transition of the output signal generated by the output buffer, keeping $R_{HL}$ less than the characteristic impedance of the transmission line, may result in severe undershoots and overshoots related to the desired steady state value.

FIG. 3B illustrates the output voltage of an output buffer as it undergoes an output transition from a high state to a low state. FIG. 3B shows the waveform at the output node 28 keeping $R_{HL}$ much less than the transmission line impedance. In addition the problems associated with ringing like over voltage, threshold crossing etc. may degrade the performance of the system.

Accordingly, there is a need to provide an improved output buffer that eliminates the ringing effects and at the same time meets the high speed specifications.

SUMMARY

The present disclosure generally provides an output buffer module providing constant output impedance for driving transmission line loads in the integrated circuits. Accordingly, a module according to one embodiment of the present disclosure improves the output of the integrated circuits during state transitions.

It an object of the present disclosure to provide an output buffer circuit for improving an output of the buffer during state transitions. For example, the present disclosure provides an output buffer circuit for suppressing ringing during state transitions by generating a variable output impedance proportional to a transmission line impedance.

In one embodiment, the present disclosure could provide a buffer circuit. The buffer circuit could include a first impedance control circuit generating a first control signal, said control circuit receiving a first input from an output terminal and a second input from an input data signal. The buffer circuit could also include a pull down NMOS transistor having a drain connected to said output terminal, a source connected to a ground voltage, and a gate connected to an output of said first impedance control circuit, said NMOS transistor receiving said first control signal for adjusting its impedance. The buffer circuit could also include a second impedance control circuit generating a second control signal, said second control circuit receiving a first input from said output terminal and a second input from a second input data signal. The buffer circuit could further include a pull up PMOS transistor having a drain connected to said output terminal, a source connected to a supply voltage, and a gate connected to an output of said second impedance control circuit, said PMOS transistor receiving said second control signal for adjusting its impedance.

In another embodiment, the present disclosure provides an impedance control circuit generating a control signal for varying an impedance of an output node. The impedance control circuit could include a first PMOS transistor having a source connected to a supply voltage, a drain connected to a control signal, and a gate connected to a data signal through an inverter. The impedance control circuit could also include a second PMOS transistor having a source connected to the control signal, a drain connected to a ground voltage, and a gate connected to an output voltage node. The impedance control circuit could further include a first NMOS transistor having a drain connected to the control signal, a source connected to a ground terminal, and a gate connected to the data signal through said inverter. In addition, the impedance circuit could still further include a second NMOS transistor having a drain connected to the output voltage node, a source connected to the ground terminal, and a gate connected to the control signal.

In still another embodiment, the present disclosure could provide an impedance control circuit generating a control signal for varying an impedance of an output node. The impedance control circuit could include a first PMOS transistor having a source connected to a supply voltage, a drain connected to a control signal and a gate connected to a first data input through an inverter. The impedance control circuit could also include a second PMOS transistor having a source connected to the control signal, a drain connected to a ground voltage and a gate connected to an output node. The impedance control circuit could further include a first NMOS transistor having a drain connected to the output node, a source connected to a virtual node, and a gate connected to a second data input. The impedance control circuit could still further include a second NMOS transistor having a drain connected to the source of said first NMOS transistor through said virtual node, a source connected to the ground voltage, and a gate connected to the control signal.

In yet another embodiment, the present disclosure could provide an impedance control circuit generating a control signal for varying an impedance of an output node. The impedance control circuit could include a first NMOS transistor having a drain connected to a supply voltage, a source connected to a control signal, and a gate connected to a first data signal. The impedance control circuit could also include a first PMOS transistor having a source connected to the control signal, a drain connected to a ground voltage, and a gate connected to an output node. The impedance control circuit could further include a second NMOS transistor having a drain connected to the control signal, a source connected to the ground voltage, and a gate connected to a second data signal. The impedance control circuit could still further include a third NMOS transistor having a drain connected to the output node, a source connected to the ground voltage, and a gate connected to the control signal.

In yet another embodiment, the present disclosure could provide an impedance control circuit generating a control signal for varying an impedance of a output node. The impedance control circuit could include a first NMOS transistor having a drain connected to a supply voltage, a source connected to a control signal, and a gate connected to a first data signal. The impedance control circuit could also include a first PMOS transistor having a source connected to the control signal, a drain connected to a ground voltage, and a gate connected to an output node. The impedance control circuit could further include a second NMOS transistor having a drain connected to the output node, a source connected to a virtual node, and a gate connected to a second data signal. The impedance control circuit could still further include a third NMOS transistor having a drain connected to the source of the second NMOS transistor through said virtual node, a source connected to the ground voltage, and a gate connected to the control signal.

Other technical features may be readily apparent to one skilled in the art from the following figures, descriptions and claims.

BRIEF DESCRIPTION OF THE DRAWINGS

For a more complete understanding of this present disclosure and its features, reference is now made to the following description, taken in conjunction with the accompanying drawings, in which.

DETAILED DESCRIPTION

Figure 1:
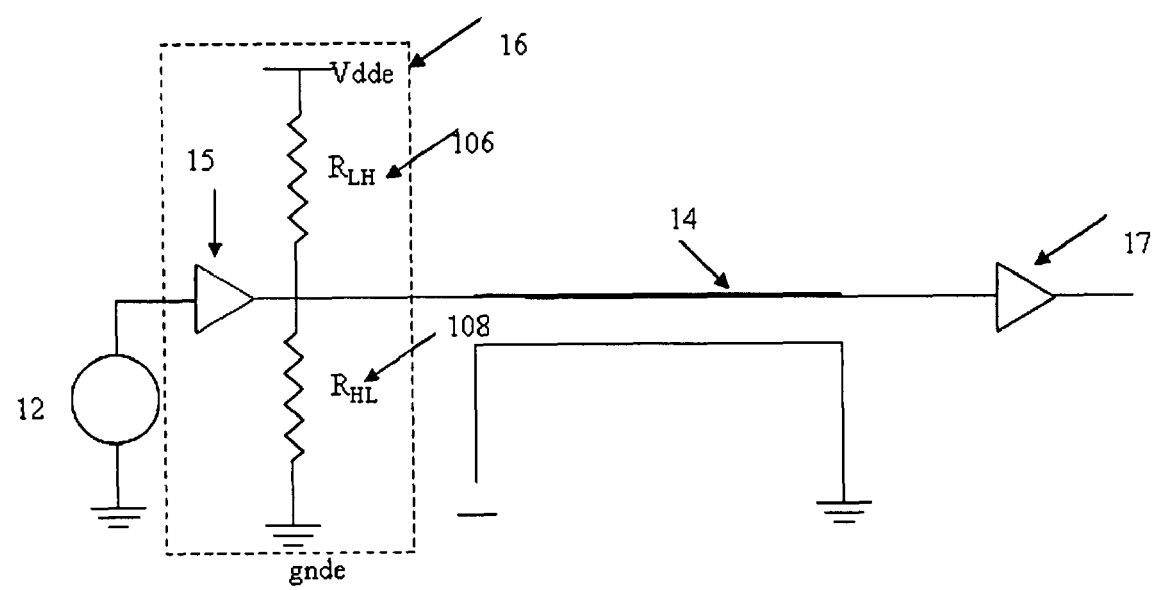
FIG. 1 illustrates an output buffer coupled to a transmission line.
Figure 2:
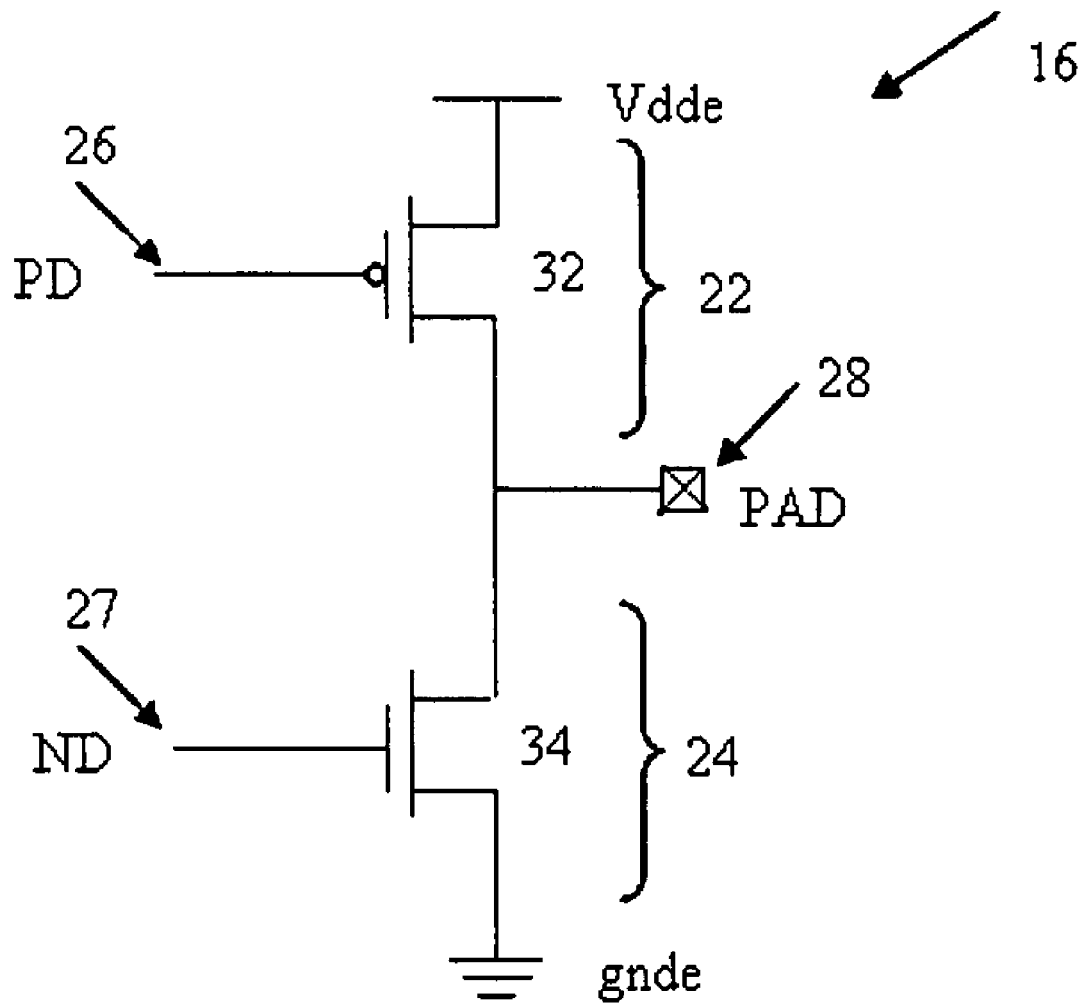
FIG. 2 is a schematic diagram of a driver which may be employed in one of the output buffer devices 16, shown in FIG. 1.
Figure 3A:
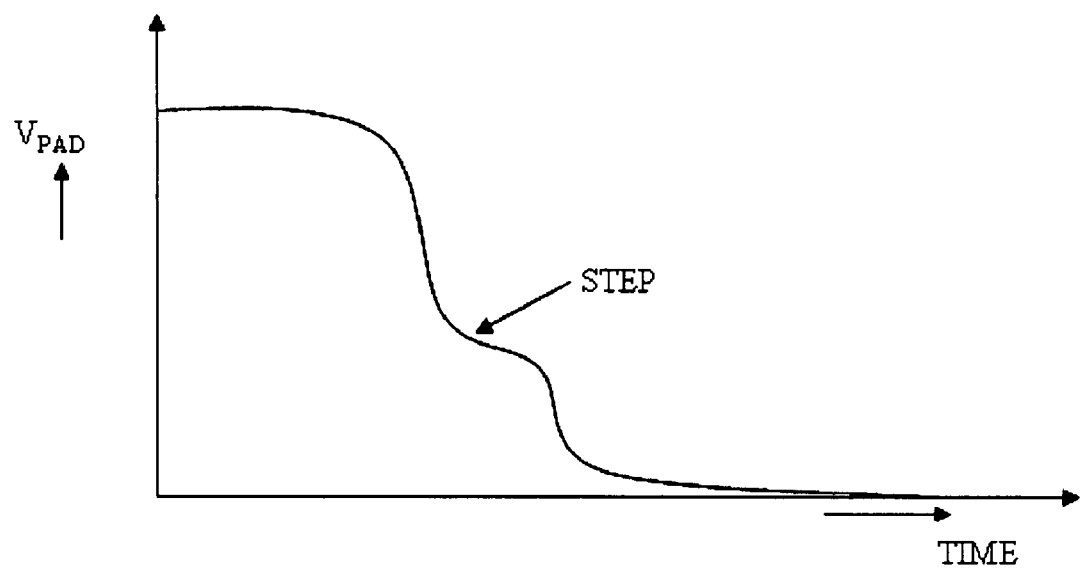
FIG. 3A illustrates the output voltage of an output buffer as it undergoes an output transition from a high state to a low state.
Figure 3B:
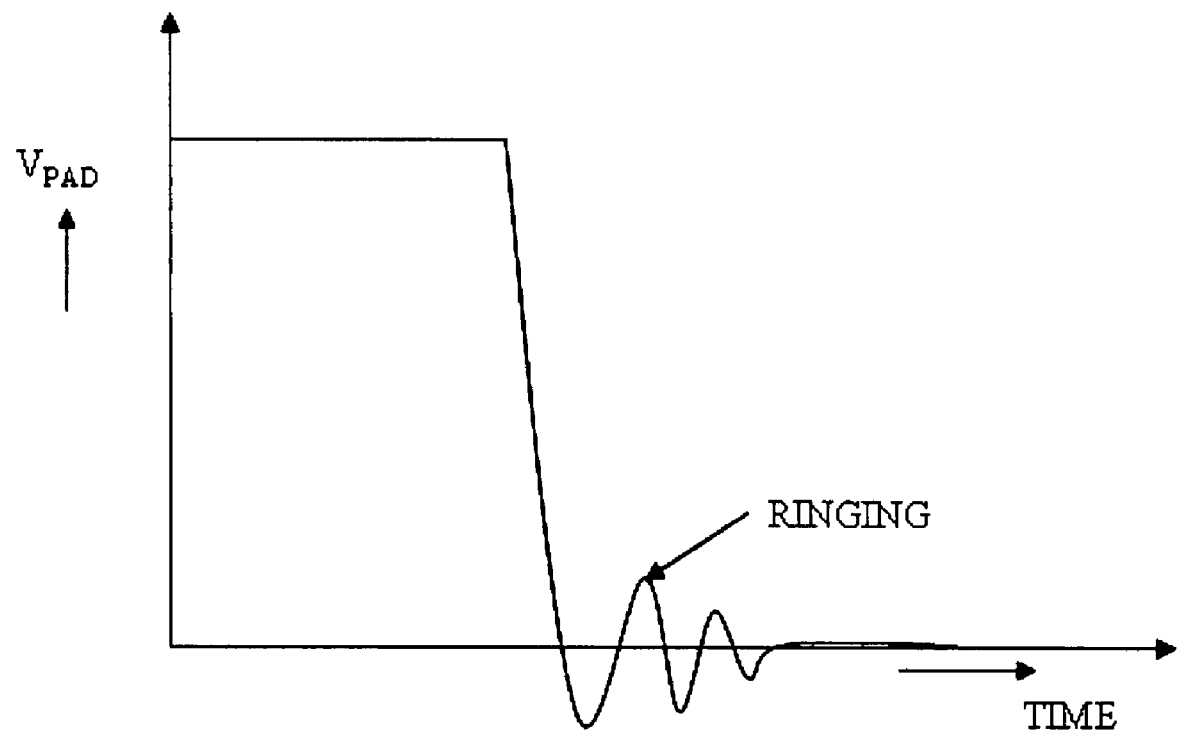
FIG. 3B illustrates the output voltage of an output buffer affected by ringing as it undergoes an output transition from a high state to a low state.

The preferred embodiments of the present disclosure will be described in detail with reference to the accompanying drawings. However, the present disclosure is not limited to the preferred embodiments. The present disclosure can be modified in various forms. The preferred embodiments of the present disclosure are only provided to explain more clearly the present disclosure to the ordinarily skilled in the art of the present disclosure. In the accompanying drawings, like reference numerals are used to indicate like components.

Figure 4:
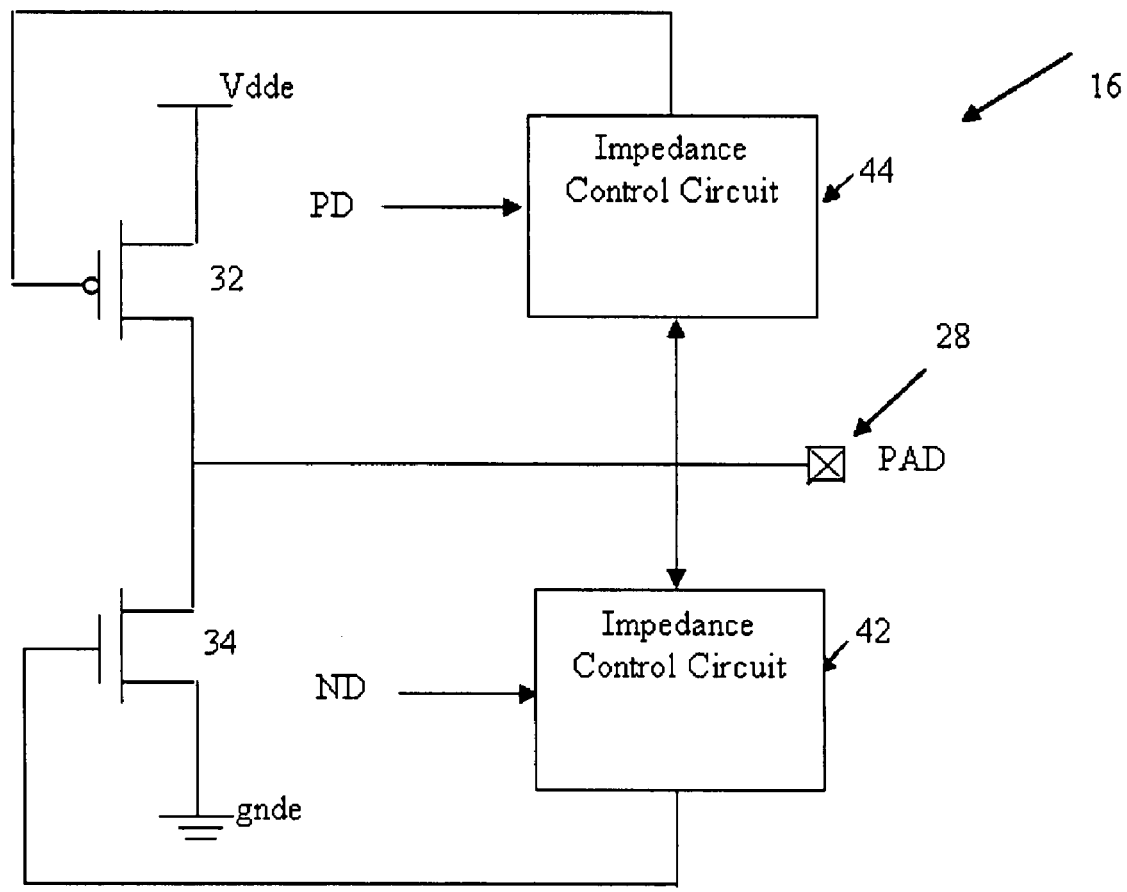
FIG. 4 is a block diagram of an output buffer circuit according to one embodiment of the present disclosure.

In one embodiment, the present disclosure generally provides a modified CMOS output buffer to suppress ringing at the output of a high speed CMOS output buffer. Accordingly, the present disclosure operates as follows to avoid the above stated ringing problem. Referring to FIG. 4, the impedance of output buffer is set relatively low with respect to transmission line impedance during the initial transition period. The impedance is then dynamically controlled during the final transition period where the ringing occurs.

FIG. 4 is a block diagram of the output buffer 16 coupled to the transmission line 14 at node 28. The embodiment of output buffer 16 shown in FIG. 4 is for illustration only. Other embodiments of the output buffer 16 may be used without departing from the scope of this disclosure.

In FIG. 4, an NMOS transistor 34 is a pull down driver coupled to the node 28, a ground voltage and an output of the impedance control circuit 42. The impedance control circuit 42 includes a pair of inputs coupled to the output node 28 and a data signal ND. The impedance control circuit 42 generates a control signal which is subsequently provided to the gate of the NMOS transistor 34.

The control signal varies the impedance of the pull down transistor 34, where the ringing occurs. More particularly, if the voltage at the output node 28 decreases beyond the ground voltage, the control circuit 42 operates to increases the impedance of the NMOS driver to offset the decrease in impedance of pull-down driver that would otherwise occur if the gate of the NMOS transistor was connected directly to the input data signal ND. The control circuit 42 is a feedback path between the output node 28 and the gate of the NMOS transistor 34.

When ND switches from a High to Low logic level, the control circuit 42 passes ND to the gate of the NMOS transistor 34, those skilled in the art will understand that the output impedance may be made relatively small through the use of a low impedance component at the output buffer stage. When the NMOS transistor 34 is fully switched ON, the pull down device conducts current for discharging output node 28. As the voltage of the output node 28 decreases towards a ground voltage, the control circuit 42 decreases the voltage magnitude of control signal and the impedance of pull down transistor increases.

Figure 5:
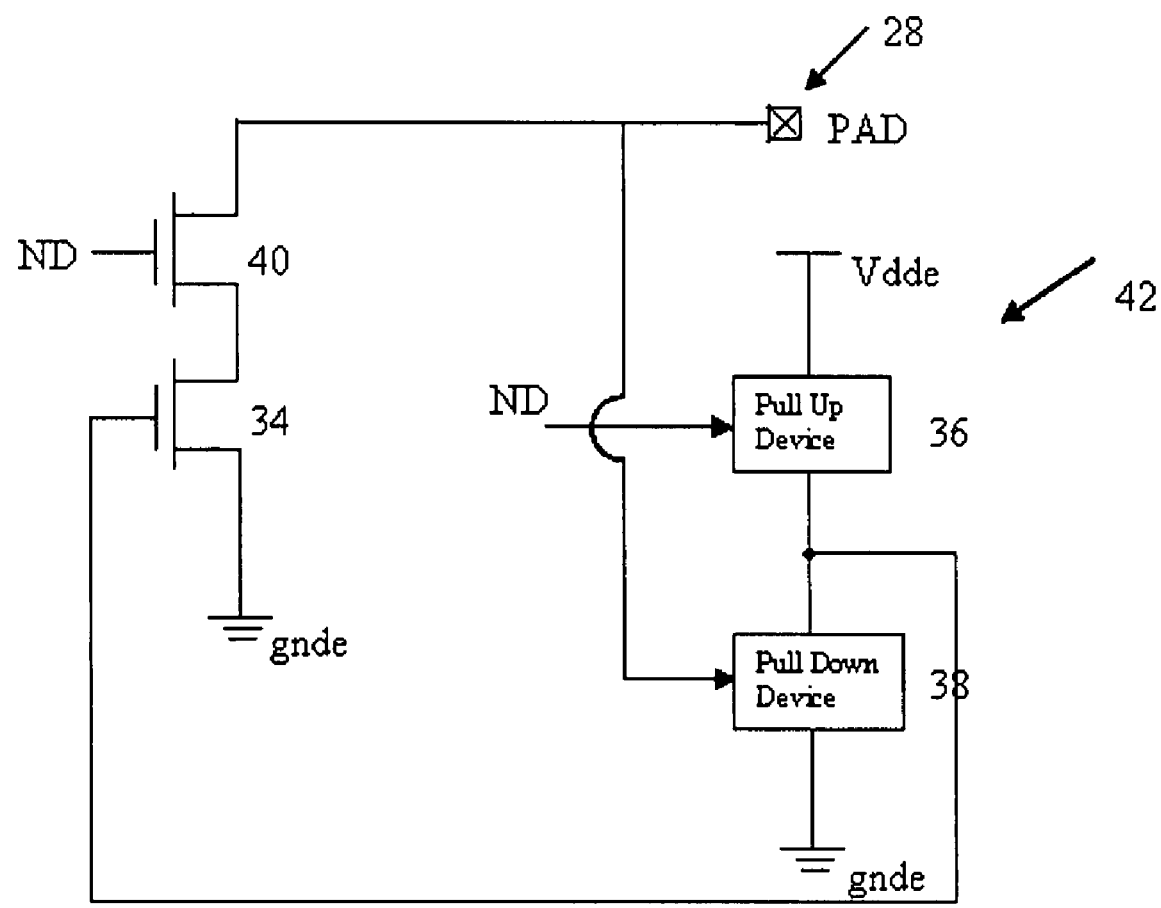
FIG. 5 illustrates a block diagram of a control circuit according to one embodiment of the present disclosure.

FIG. 5 is a block level representation of the impedance control circuit 42 as shown in FIG. 4. The embodiment of impedance control circuit 42 shown in FIG. 5 is for illustration only. Other embodiments of impedance control circuit 42 may be used without departing from the scope of this disclosure.

In FIG. 5, the pull up device 36 is controlled by the data signal ND and a pull down device 38 is controlled by the PAD signal 28. The pull up/pull down devices of the present disclosure can be implemented in various alternate forms and are not limited by the way of examples and embodiments shown in the drawing.

Figure 6:
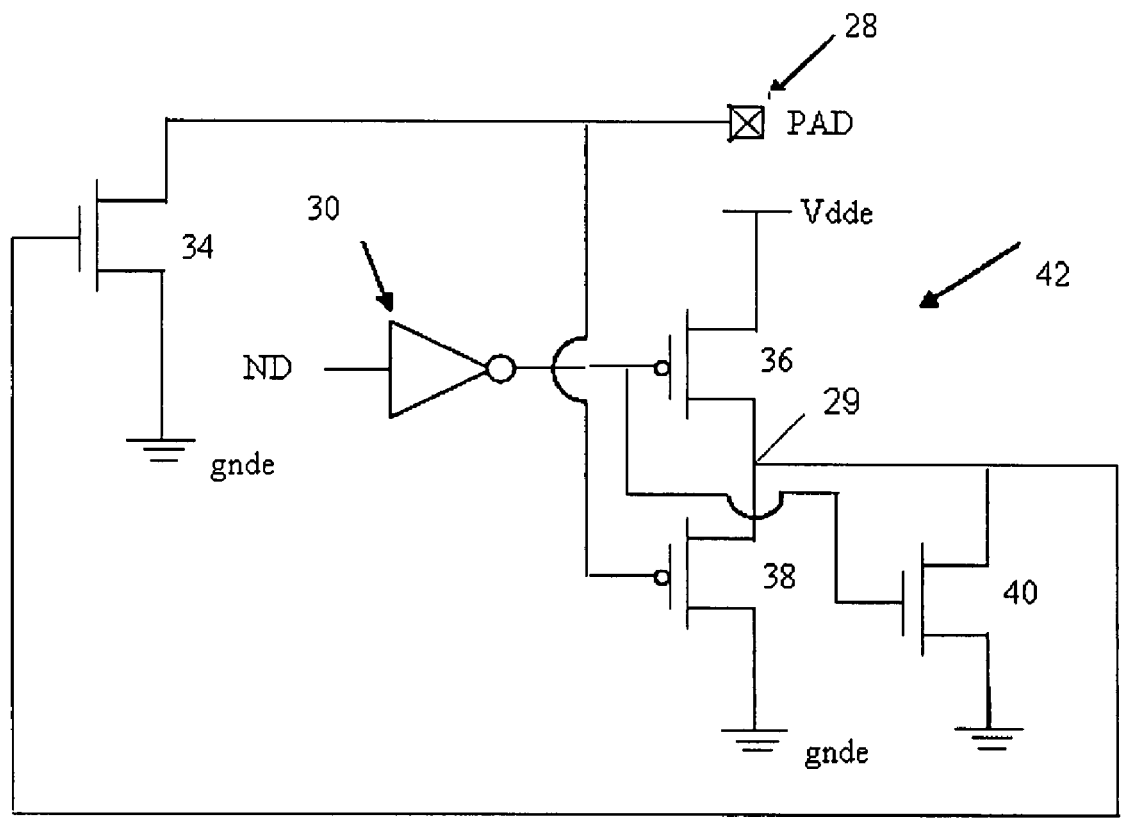
FIG. 6 is the schematic diagram of an output buffer pull down device according to one embodiment of the present disclosure.

FIG. 6 illustrates one embodiment of the impedance control circuit 42. The embodiment of impedance control circuit 42 shown in FIG. 6 is for illustration only. Other embodiments of impedance control circuit 42 may be used without departing from the scope of this disclosure.

In FIG. 6, the control circuit 42 includes a PMOS transistor 36 and 38, an NMOS transistor 40 and an inverting device 30. The gate of the PMOS transistor 36 is coupled to the supply node Vdde, a data signal ND through the inverting device 30 and the control signal 29. The gate of the PMOS transistor 38 is coupled to the ground node gnde, an output node 28 and the control signal 29. The NMOS transistor 40 is coupled to the ground node gnde, the data signal ND through an inverting device 30 and the control signal 29.

When the pull down driver is enabled, the data signal ND is at a high logic level, now the PMOS transistor 36 is ON and the NMOS transistor 40 is OFF and the control circuit 42 biases the pull down transistor 34 to a high logic level. As the voltage at the output node 28 decreases the PMOS transistor 38 of the control circuit 42 is gradually turned ON and the voltage of the control signal 29 decreases to increase the impedance of the pull down transistor 34. When the pull down driver is disabled ND is at a low logic level and the NMOS transistor 40 is turned ON to bring the control signal 29 to a low logic level, thus turning off the pull down driver.

Figure 7:
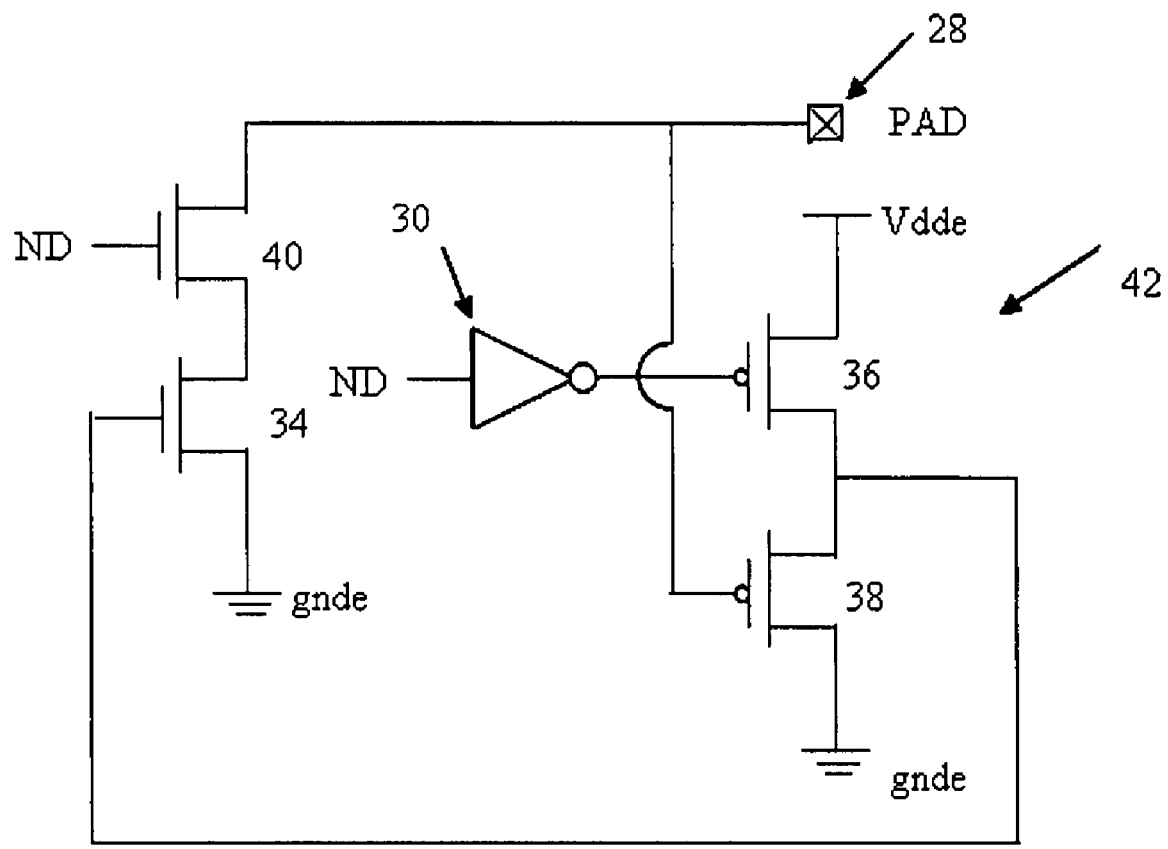
FIG. 7 is an alternate schematic diagram of the previous embodiment of output buffer pull down devices.

FIG. 7 is an alternative embodiment of the present disclosure shown in FIG. 6. The embodiment of impedance shown in FIG. 6 is for illustration only. Other embodiments of may be used without departing from the scope of this disclosure.

In FIG. 7, the only difference is that the NMOS transistor 40 is removed from the control circuit 42 and added in series with the pull down transistor 34, to disable the pull down driver, when the data signal ND is at a low logic level. A complementary structure can easily be implemented for the pull up driver 32.

Figure 8:
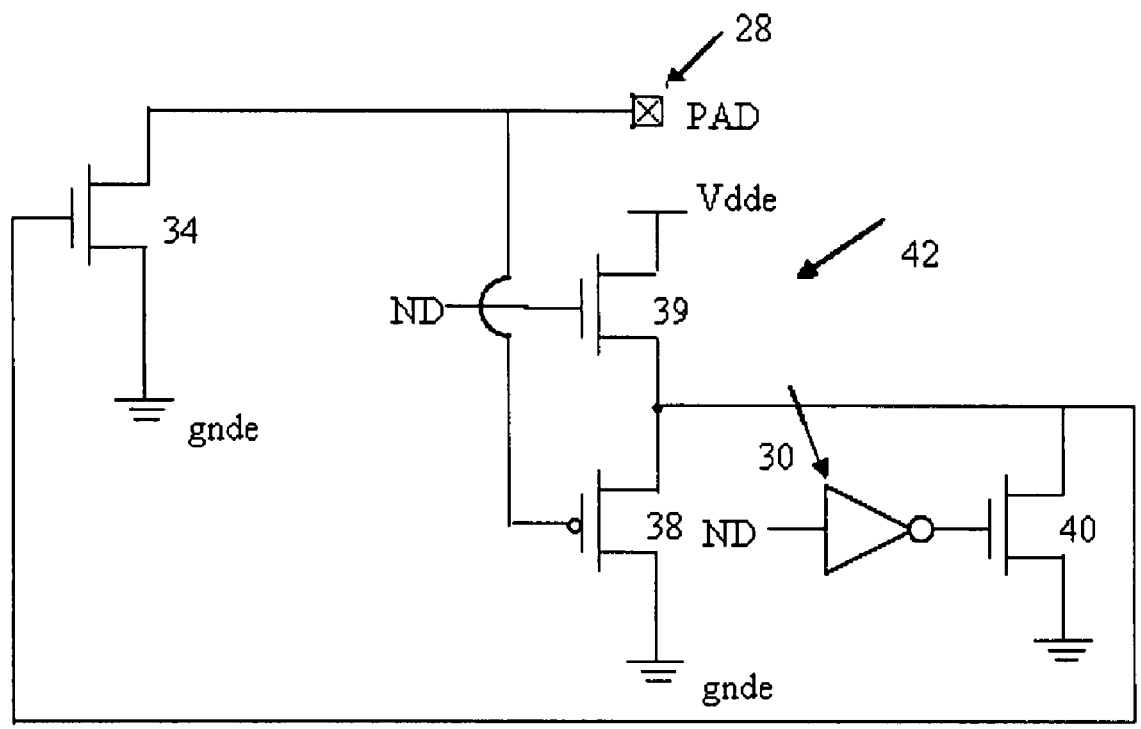
FIG. 8 is the schematic diagram of another embodiment of the output buffer pull down device.

FIG. 8 illustrates another embodiment of the impedance control circuit 42. The embodiment of impedance control circuit 42 shown in FIG. 8 is for illustration only. Other embodiments of impedance control circuit 42 may be used without departing from the scope of this disclosure.

In FIG. 8, the PMOS transistor 36 with an inverted ND signal as input has been replaced by an NMOS transistor with an ND data signal as its input. The drawback in this embodiment is that the initial drive of the pull down driver 34 is reduced from the voltage Vdde to (Vdde-Vtn) resulting in an increased driver area.

Figure 9:
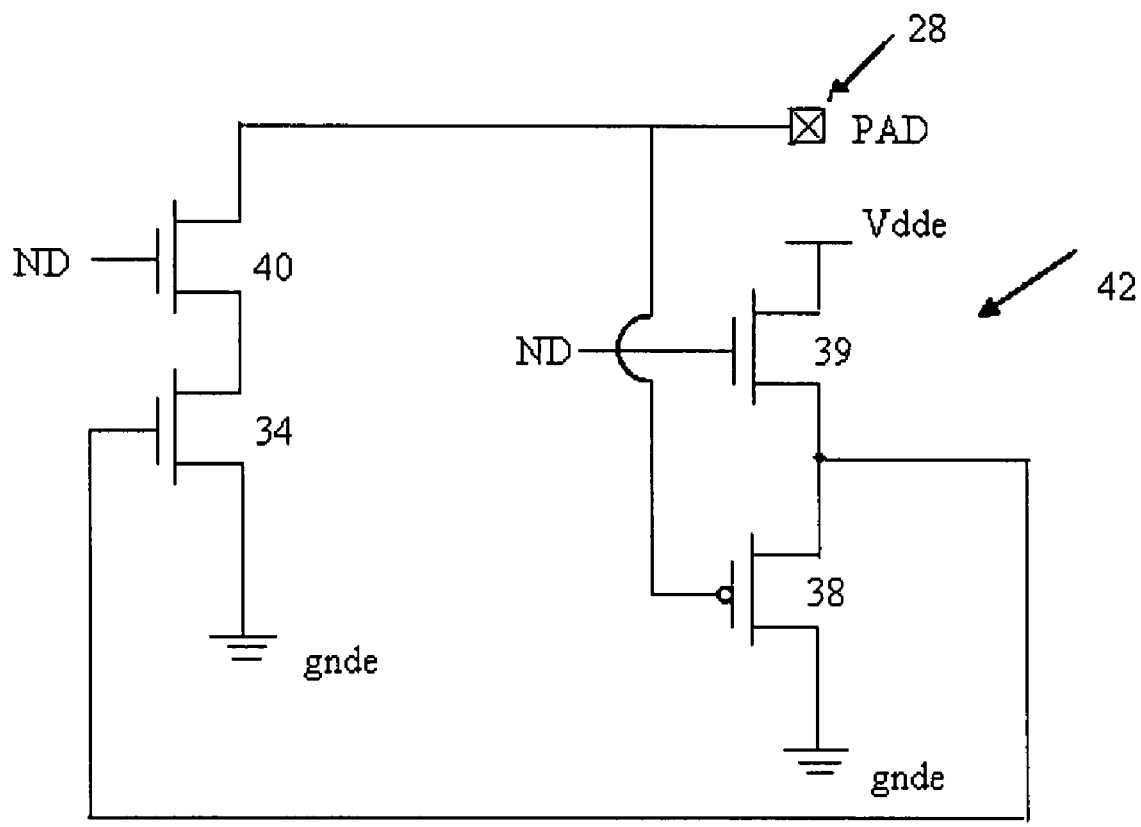
FIG. 9 is the alternate schematic diagram of the previous embodiment of output buffer pull down devices.

FIG. 9 is an alternative embodiment of the proposed previous architecture. The embodiment shown in FIG. 9 is for illustration only. Other embodiments of impedance control circuit 42 may be used without departing from the scope of this disclosure.

In FIG. 9, the only difference is that the NMOS transistor 40 is removed from the control circuit 42 and added in series with the pull down transistor 34, to disable the pull down driver, when the data signal ND is at a low logic level. A complementary structure can easily be implemented for pull up driver 32.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Although the disclosure of circuit has been described in connection with the embodiment of the present disclosure illustrated in the accompanying drawings, it is not limited thereto. While this present disclosure has described certain embodiments and generally associated methods, alterations and permutations of these embodiments and methods will be apparent to those skilled in the art. Accordingly, the above description of example embodiments does not define or constrain this present disclosure. Other changes, substitutions, and alterations are also possible without departing from the spirit and scope of this present disclosure, as defined by the following claims.

What is claimed is:

1. An output buffer circuit to suppress ringing during state transitions, said buffer circuit comprising:

a first impedance control circuit generating a first control signal, said control circuit receiving a first input from an output terminal and a second input from an input data signal, the first impedance control circuit comprising a pull-up device driven by said input data signal and a pull-down device driven by said first input from said output terminal;

an NMOS transistor having a drain connected to said output terminal, a source connected to a ground voltage, and a gate connected to an output of said first impedance control circuit, said NMOS transistor receiving said first control signal for adjusting an impedance of said NMOS transistor;

a second impedance control circuit generating a second control signal, said second control circuit receiving a first input from said output terminal and a second input from an second input data signal; and a PMOS transistor having a drain connected to said output terminal, a source connected to a supply voltage, and a gate connected to an output of said second impedance control circuit, said PMOS transistor receiving said second control signal for adjusting an impedance of said PMOS transistor.

2. The output buffer circuit according to claim 1, wherein a variable output impedance of said output buffer circuit is proportional to a transmission line impedance associated with said output buffer.

3. The output buffer circuit according to claim 1, wherein said first impedance control circuit is configured to operatively increase an impedance of said NMOS transistor.

4. The output buffer circuit according to claim 3, wherein said first impedance control circuit increases an impedance of said NMOS transistor when a voltage at the output terminal decreases beyond a ground voltage.

5. The output buffer circuit according to claim 1, wherein said first impedance control circuit is configured to pass the first input to the gate of said NMOS transistor.

6. The output buffer circuit according to claim 5, wherein said first impedance control circuit passes the first input to the gate of said NMOS transistor when the first input switches from a high logic level to a low logic level.

7. The output buffer circuit according to claim 1, wherein said NMOS transistor comprises a pull down NMOS transistor.

8. The output buffer circuit according to claim 1, wherein said PMOS transistor comprises a pull up PMOS transistor.

9. A method for suppressing ringing during state transitions, the method comprising:
  generating, by a first impedance control circuit, a first control signal, the first impedance control circuit receiving a first input from an output terminal and a second input from an input data signal, the first impedance control circuit comprising a pull-up device driven by the input data signal and a pull-down device driven by the first input from the output terminal;
  adjusting an NMOS transistor with the first control signal, the NMOS transistor having a drain connected to the output terminal, a source connected to a ground voltage, and a gate connected to an output of said first impedance control circuit;
  generating, by a second impedance control circuit, a second control signal, the second impedance control circuit receiving a first input from said output terminal and a second input from a second input data signal; and
  adjusting a PMOS transistor with the second control signal, the PMOS transistor having a drain connected to said output terminal, a source connected to a supply voltage, and a gate connected to an output of said second impedance control circuit.

10. The method according to claim 9, wherein a variable output impedance of the output buffer circuit is proportional to a transmission line impedance associated with the output buffer.

11. The method according to claim 9, further comprising increasing an impedance of the NMOS transistor by the first impedance control circuit.

12. The method according to claim 11, increasing the impedance of the NMOS transistor when a voltage at the output terminal decreases beyond a ground voltage.

13. The method according to claim 9, wherein the first impedance control circuit is configured to pass the first input to the gate of the NMOS transistor.

14. The method according to claim 13, wherein the first impedance control circuit passes the first input to the gate of the NMOS transistor when the first input switches from a high logic level to a low logic level.

15. The method according to claim 9, wherein the NMOS transistor comprises a pull down NMOS transistor.

16. The method according to claim 9, wherein the PMOS transistor comprises a pull up PMOS transistor.

17. An output buffer circuit for suppressing ringing during state transitions, said buffer circuit comprising:
  a first control circuit configured to adjust an impedance of a first transistor, wherein the first control circuit receives a first input from an output terminal and a second input from a first input data signal, the first impedance control circuit comprising a pull-up device driven by said input data signal and a pull-down; device driven by said first input from said output terminal;
  the first transistor having a drain connected to said output terminal, a source connected to a ground voltage, and a gate connected to an output of said first control circuit;
  a second control circuit configured to adjust an impedance of a second transistor, the second control circuit comprising a pull up device and a pull down device, wherein the second control circuit receives a first input from said output terminal and a second input from a second input data signal; and
  the second transistor having a drain connected to said output terminal, a source connected to a supply voltage, and a gate connected to an output of said second impedance control circuit.

18. The output buffer according to claim 17, wherein the first transistor is a NMOS transistor and the second transistor is a PMOS transistor.

19. The output buffer according to claim 17, wherein the first control circuit is configured to increase the impedance of the first transistor when a voltage at the output terminal decreases beyond a ground voltage.

20. The output buffer according to claim 17, wherein the first control circuit is configured to pass the first input to the gate of the first transistor.

* * * * *